United States Patent [19]

Schulz

[11] 4,049,960
[45] Sept. 20, 1977

[54] FOCUSING ARRANGEMENT

[75] Inventor: Hansrichard Schulz, Villingen-Schwenningen, Germany

[73] Assignee: Canon Kabushiki Kaisha, Tokyo, Japan

[21] Appl. No.: 633,099

[22] Filed: Nov. 18, 1975

Related U.S. Application Data

[63] Continuation of Ser. No. 463,690, April 24, 1974, abandoned.

[51] Int. Cl.$^2$ .............................. G01J 1/20; H01J 39/12
[52] U.S. Cl. ............................... 250/201; 250/209; 354/25
[58] Field of Search ............. 356/4; 250/201, 204, 250/209, 578; 354/25, 31

[56] References Cited
U.S. PATENT DOCUMENTS

| | | | |
|---|---|---|---|
| 2,744,200 | 5/1956 | Taylor | 250/578 |
| 3,035,176 | 5/1962 | Kis et al. | 356/4 |
| 3,084,301 | 4/1963 | Mohan, Jr. | 250/578 |
| 3,274,913 | 9/1966 | Biedermann et al. | 354/25 |
| 3,511,155 | 5/1970 | Yamada | 354/25 |
| 3,713,371 | 1/1973 | Kurihara et al. | 250/209 |
| 3,937,950 | 2/1976 | Hosoe et al. | 250/201 |

*Primary Examiner*—S.C. Buczinski
*Attorney, Agent, or Firm*—Toren, McGeady and Stanger

[57] ABSTRACT

In the arrangement disclosed, a photoconductive cell has electrical characteristics which depend upon its optical exposure. An optical system focuses an image upon the cell. An electrical system utilizes the output of the cell on the basis of the light upon the cell. The cell includes a multiplicity of photoconductive portions forming at least one row transverse to the direction of image intensity changes so that different portion sense different intensities. The electrical means are connected to a plurality of the portions. The portions may be formed into an elongated integral strip whose direction changes and whose edges are insulated from each other. Alternately the portions may be connected electrically to form a continuous electrical strip. The strip may have a spiral shape. In one embodiment the portions are connected together to form an AND or OR gate. Two identical cells may straddle a desired image plane and be subject to the same image. Suitable means respond to the differences between the cells to drive a motor which adjusts an image-forming objective.

46 Claims, 15 Drawing Figures

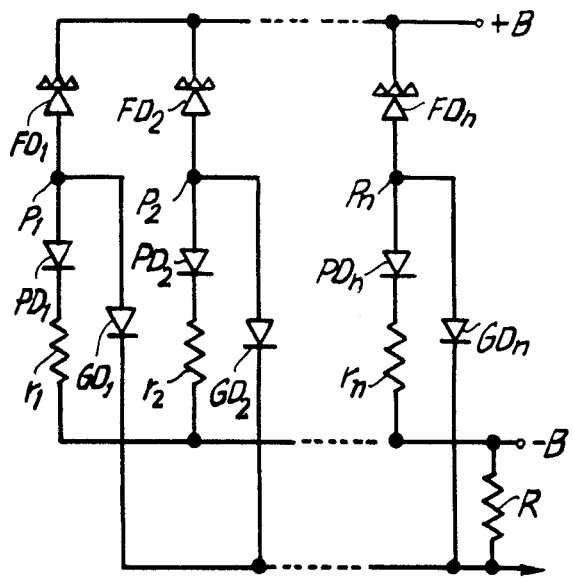
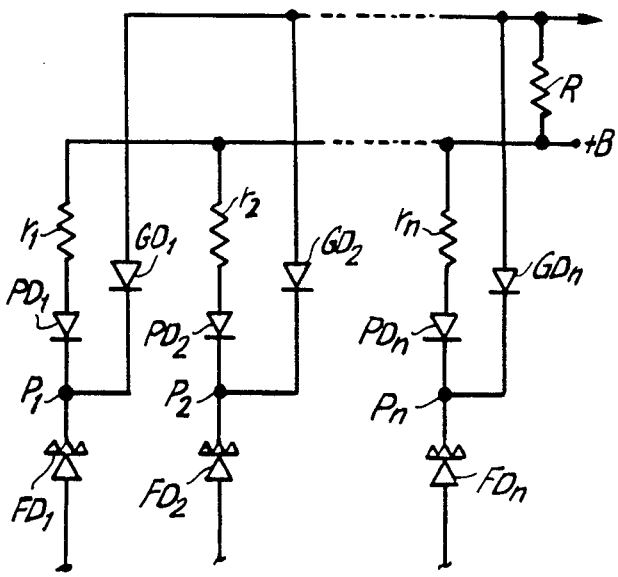
FIG.11  FIG.12
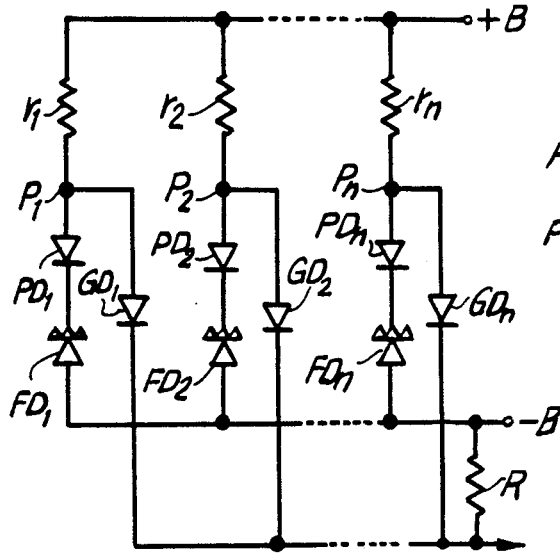
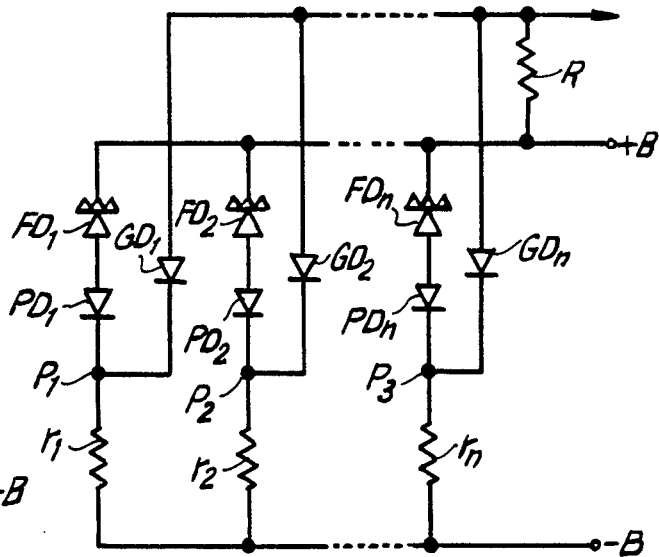
FIG.13  FIG.14

FOCUSING ARRANGEMENT

This is a continuation of application Ser. No. 463,690 filed Apr. 24, 1974, now abandoned.

BACKGROUND OF THE INVENTION

The invention relates to an arrangement for automatic-range finding, particularly for sharply focusing a motor-driven objective lens.

Modern cameras furnish automatic exposure measurement devices and facilities for setting the diaphragm and/or the exposure time. However, no camera on the market successfully furnishes sharp automatic focusing.

Automatic range finding methods are known, but implementing them is so costly that they are completely unsuitable for cameras. One known automatic objective focusing method involves determining the range by means of radar or optical goniometry and setting the objective to the determined range by a motor. Apart from the fact that the costs of the equipment are rather high, automatic and continuous check of the definition achieved is generally not possible.

This last mentioned drawback is avoided in a recently developed special optical system. Here the signal controlling the motor drive is generated by means of a photocell which receives light deflected by a mirror from the optical path of the objective. In this arrangement an annular reflecting mirror deflects the marginal rays of a special objective onto an axially oscillating photocell. During the oscillation of the cell through the range of maximum image sharpness, the voltage generated by the photocell in dependence on the light density passes through a flat maximum. To obtain automatic readjustment of the definition the position of the maximum is used by a phase detector which receives a reference signal in the form of the a-c voltage required for the mechanical oscillating drive.

But this method can only be used with an objective where the front and rear elements are arranged sufficiently far from each other to provide room between them for the above mentioned annular reflecting mirror. The latter only deflects marginal rays with extremely low depth of focus, to the photocell. In the photocell, these low depth of focus marginal rays cause a light density which traverses a flat maximum in dependence on the image sharpness, hence with the photocell moving in the direction of the rays.

The mechanism for generating the oscillating movement of the photocell is costly and susceptible to trouble and makes the use of complicated phase detectors etc., an absolute necessity. However, this solution is not applicable to usually existing objectives where close front and rear elements constitute parts of an assembled objective.

An object of this invention is to avoid these shortcomings.

Still another object is to improve automatic focusing systems.

Another object of the present invention is to provide an arrangement for automatic focus detection where commercial objectives can be used and which can be realized with a minimum of circuit and material expenditure.

SUMMARY OF THE INVENTION

According to a feature of the invention a mirror deflects part of the light from the optical path of a motor driven objective onto a photocell which generates a signal controlling the objective motor drive in dependence on the contrast of an image produced on its surface. According to another feature, the photoconductive cell includes elementary or incremental regions connected in series and arranged in the form of one or several rows. These extend, at a great number of points over the entire row width, perpendicular to the light-dark transistions of the image structure.

The photoconductive cell according to the invention is characterized by a resistance maximum when the definition of the image produced on its surface is optimum. This effect is due to the fact that a maximum contrast appears with optimum image sharpness, that is the dark image areas are darkest and the light image areas are lightest, while the dark contrast is lower when the image is blurred. As is shown mathematically in the description of the figures, the total resistance of the series-connected elementary or incremental regions of the photoconductive cell increases with increasing contrast. Thus a signal controlling the sharp focusing of the objective can be derived from the variation of the resistance.

According to another feature of the invention, to derive a control signal by means of such a photoconductive cell from any image structure, the series connected or incremental regions of the photoconductive cell are distributed in the form of one or several rows over the image area in such a way that all possible directional angles of the light-dark transitions are uniformly determined.

According to still another feature of the invention, the rows of the photoconductive cell are distributed in any desired, possibly varying, orientation over the image plane and connected in series. The ends of the series-connected rows outside the image area are connected with light-insensitive lead wires. Preferably the wires are provided with a light-independent shunt, for example, of silver.

According to another feature of the invention, the connections are provided outside the image region.

According to another feature of the invention the photoconductive cell rows are arranged bifilarly.

According to another feature of the invention the rows are arranged in the form of polygonal-, particularly rectangular, circular etc. spirals.

According to another feature of the invention the rows are distributed in sinusoidal, meander, sawtooth, star, or similar form over the image area.

With these arrangements the maximum total resistance of the series-connected cell rows is always achieved with maximum image sharpness, regardless of the direction of the image structures.

According to another feature of the invention, a control circuit controls the objective motor drive. Here two idential photoconductive cells according to the invention are used. These photoconductive cells are mounted in two different image planes, each at a different distance from the objective, so that when the objective is set for sharp focusing, the two photocells are in front of and behind the plane of optimum image sharpness. Preferably they are offset from the optimum plane by the same distance. The difference in output between the cells is measured and used to control the objective drive motor.

According to another feature of the invention, the two photoconductive cells are connected in series between a voltage source to form a voltage divider whose divider center is coupled through an amplifier circuit with a high input resistance to the control circuit of the driving motor. The use of an amplifier circuit with a high input resistance avoids an undesired load on the high-ohmic photoconductive cells whose resistance value is of the order of megohms. For this reason a field effect transistor, preferably wired as a source follower, is arranged in the input circuit.

According to another feature of the invention, the control circuit of the drive motor, preferably a d-c motor, is set to cause itself and the objective to assume its rest position only when both photoconductive cells of the voltage divider have the same resistance value. This occurs when the images produced on the surface of the photoconductive cells, which are arranged the same distance in front of and behind the plane of optimum image sharpness, are equally blurred. The objective is adjusted so that the image produced under these conditions, for example, on the emulsion or in the viewing plane, has a maximum image sharpness.

The use of the photoconductive cells according to the invention in a divider circuit has the great advantage that the potential of the divider point, with uniformly illuminated photoconductive cells, remains substantially independent of the intensity of illumination over several decimal powers of the illumination.

According to another feature of the invention, a double push-pull driver stage composed of complementary transistors serves as a control circuit behind the input loop of the amplifier circuit. It controls a double push-pull output stage, likewise composed of complementary power transistors and forming a bridge in whose diagonal the drive motor is connected. In this circuit arrangement, only one pair of the diagonally opposed complementary transistors is conductive. This then turns on one of the complementary transistors of the respective diagonal in the cascaded double push-pull circuit of the power transistors.

This circuit has the advantage that the full battery voltage less the collector-emitter voltage of the respective open power transistors, which is of the order of 0.3 V, is available for driving the motor in both rotational directions.

Thus reliable motor-driven sharp focusing is possible with optimum torque and efficiency, even with low battery voltages such as 3 volts.

According to another feature of the invention, where two identical photoconductor cells form a voltage divider, the same amount of light is fed to both photoconductive cells, and the photoconductive cells are arranged staggered relative to the direction of the beam.

According to another feature of the invention, this is achieved by a beam splitter arranged in the optical path of the objective and the photoconductive cells are arranged in varying distances from the beam splitter.

According to another feature of the invention a beam splitting prism with a square cross section serves as a beam splitter. The photoconductive cells are provided on the faces arranged in the optical path, and a distance plate of optically transmissive material is arranged between one photoconductive cell and a prism face. The distance plate extends the light path to one of the two photoconductive cells relative to the other. In the state of equilibrium, the plane of optimum image sharpness extends a distance of half the thickness of the distance plate in front of one photoconductive cell and the same distance behind the light-sensitive coat of the other photoconductive cell.

If the two cells are not symmetrically excited, that is, if a sharper image is produced on one photoconductive cell than on the other, and the plane of optimum image sharpness of one photoconductive cell is closer to the light-sensitive coat of one cell and farther away from that of the other cell, then the adjusted image distance is too small, that is, the object is farther away from the camera than indicated by the instantaneous range setting of the camera objective.

With the exception of a residual error, the automatic sharp focusing according to the invention causes the motor to move the range setting of the objective in the direction of a greater range until the plane of optimum image sharpness is in the proximity of the nominal plane in both cells.

According to another feature of the invention in special cases where an optimum operation of the sharpness-dependent photo-conductive cells with a small fine contrast is required for sharp focusing the objective, drifting of the circuit is avoided by vibrating the photoconductive cells in the direction of the beam and by using a phase detector to derive a correction signal from the signal, thus obtained by resistance variation.

In such an arrangement we still have a relative resistance increase of 6% with a fine constrast of $k=2$, so that even sharper focusings far below the response threshold of the human eye, whose capacity of evaluating sharpness is very low with these small contrast values can be realized by using the correcting signal produced from the resistance variation caused by mechanical oscillations.

An effect similar to dividing a row-type photoconductive cell into individual elementary or incremental regions is achievable according to another feature of the invention, by arranging a number of photosensitive elements, for example, photo diodes or photo transistors, in mosaic-fashion and connecting them in series to form a voltage divider with a working resistance between the voltage source. The divider centers are connected by gate diodes to a load resistance common to all voltage dividers to generate the control signal. Preferably small discrete photosensitive elements with a square cross section are arranged in rows side by side. All voltage dividers are connected parallel to each other. Silicon photo diodes are particularly suitable as photosensitive elements.

According to another feature of the invention, and in order to obtain a maximum modulation range, so-called potential-equalizing diodes are arranged in the voltage dividers so that their pass direction is oppositely directed to that of the photosensitive elements.

According to another feature of the invention, the photo diodes, the gate diodes, the working resistances, and the load resistance form an OR-gate so that a maximum voltage on the load resistance occurs with maximum or minimum imaged detail brightness.

According to another feature of the invention the photo diodes, gate diodes, working resistance and the load resistance are connected to form an AND-gate so that a minimum voltage occurs on the load resistance with maximum or minimum image detail brightness.

The diode arrangement, which generates a maximum voltage with minimum image detail brightness, is analogous to a thermal PTC resistance, namely a cold conductor which operates as a dark conductor, rather than using photoconductive cell arrangements which act as light conductors. All circuits according to the invention, particularly the arrangement of the photoconductive cells according to the invention, are produced in the form of integrated circuits, which require a minimum of space, permit a simple and cost-saving series production, so that they are suitable for inexpensive and rugged miniature cameras, even for amateurs.

The photoconductive cells according to the invention, however, are not only suitable for the motor control of objectives. They also permit the production of devices for the electrical indication of optimum image sharpness.

In this connection the invention opens up additional possibilities, for example, for the production of an arrangement for automatic passive range finding where, in contrast to the presently known radar method, no separate transmitter is required since the distance of objects can be determined on the basis of the sharpness of definition measured in various image distances, as long as there is sufficient light and visibility.

These passive range finders are suitable among others for the continuous measurement of distances between moving objects, for example, motor vehicles, so that the danger of collisions can be reduced.

These and other features of the invention are pointed out in the claims. Other objects and advantages of the invention will become evident from the following detailed description when read in light of the accompanying drawings.

BRIEF DESCRIPTION OF THE DRAWINGS

FIG. 6b is a graph illustrating the dependence of the illumination on particular sites in FIG. 10a;

FIG. 11 is a schematic diagram illustrating a circuit embodying features of the invention, which circuit utilizes photo diodes arranged as a mosaic and connected to form an OR-gate for maximum image detail brightness.

FIG. 12 is a schematic diagram illustrating a circuit embodying features of the invention, which circuit utilizes photo diodes arranged as a mosaic and connected to form an AND-gate for maximum image detail brightness.

FIG. 13 is a schematic diagram illustrating a circuit embodying features of the invention, which circuit utilizes photo diodes arranged as a mosaic and connected to form an OR-gate for minimum image detail brightness, and FIG. 14 is a schematic diagram illustrating a circuit embodying features of the invention, which circuit utilizes photo diodes arranged as a mosaic and connected to form an AND-gate for minimum image detail brightness.

DETAILED DESCRIPTION OF PREFERRED EMBODIMENTS

Figure 1:
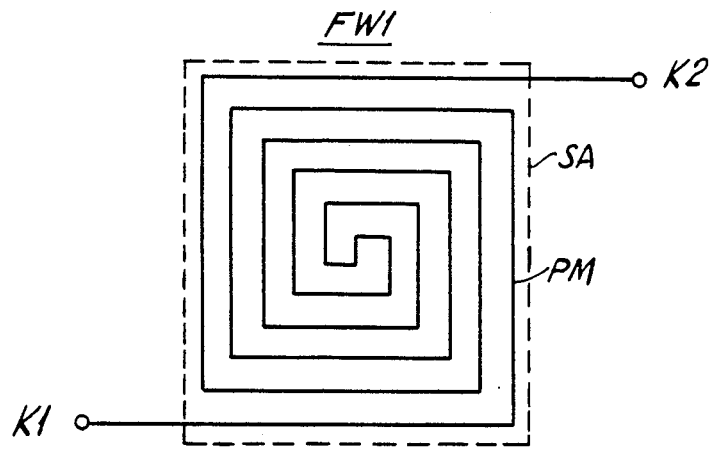
FIG. 1 is a schematic diagram illustrating a plan view of a photoconductive cell embodying features of the invention and having the shape of a rectangularly arranged bifilar spiral with connections outside the sensing area.

In FIG. 1, an elongated photoconductive material PM follows a bifilar spiral form and ends in exterior electrical terminals K1 and K2. The material forms a photoresistor or photoconductive cell FW1 whose sensing area SA is defined by the phantom lines. The material PM is illustrated as unidimensional for convenience. However, it should be noted that the elongated material has a depth as well as width and is packed within the sensing area to achieve maximum density. However, each increment is electrically connected to the adjacent increments only along the direction of elongation but is insulated from the adjacent "turns" of the bifilar path. It is this separation which is more clearly visible by showing the material PM as being unidimensional.

According to an embodiment of the invention, the material PM is composed of a single length of properly arranged material in the form of a thin coat.

According to another embodiment of the invention, the material PM is composed of a plurality of series connected individual photosensitive members either long or short.

It has been discovered that a cell such as FW1 exhibits a higher electrical resistance when a sharp image is focused upon the sensing area SA than when a blurred image is focused on the same sensing area. This arises in part because the cell FW1 exhibits a lower resistance to high contrast light changes along any length in the longitudinal direction of the material PM. The explanation for this phenomenon is described at a later point.

Figure 2:
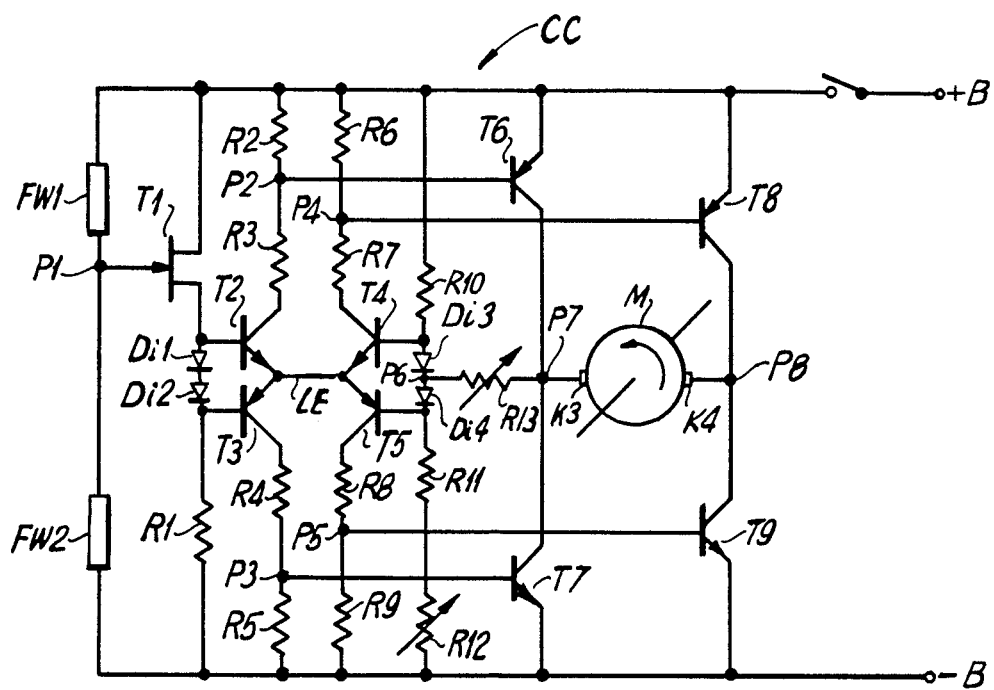
FIG. 2 is a schematic diagram illustrating a circuit embodying features of the invention and utilizing two photoconductive cells similar to those in FIG. 1 for automatically focusing an objective in a camera.
Figure 3:
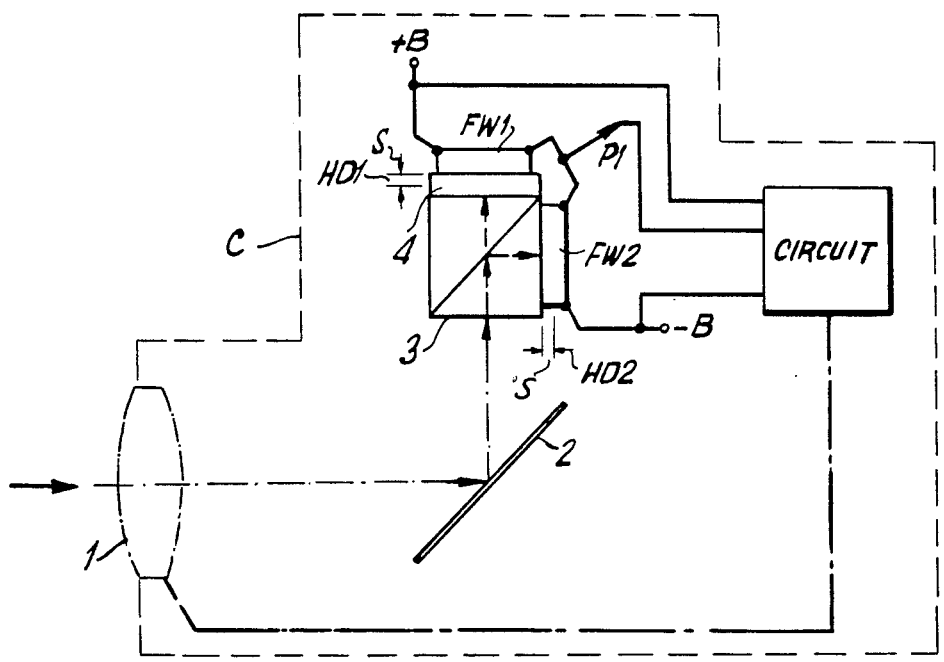
FIG. 3 is a schematic view of a portion of the camera utilizing the circuit of FIG. 2 and the cells of FIG. 1 and specifically showing the placement of the cells and the manner in which they receive light from the optical path through the objective.

In FIG. 2 the photoresistor or cell FW1 and an identical photoresistor or cell FW2 cooperate to control a motor M which drives an objective 1 of a camera C as shown in FIG. 3. In FIG. 3, the circuit of FIG. 2 is identified as CC. Here, light passing through the objective 1 strikes a mirror 2 which deflects the light to a beam splitting prism 3. The latter splits the beam evenly and applies it to the photoconductive cell FW2 whose forward sensing surface is mounted directly on the surface of the beam splitter 3. The light traveling toward the cell FW1 passes through a transparent spacer plate separating the light sensing front surface of the cell FW1 from the prism 3 by a predetermined distance. The cell FW1 and the plate 4 are mounted on the prism 3 together with the cell FW2. The plate 4 effectively extends the distance of the sensing surface of the cell FW1 from the objective 1 relative to the distance from the objective 1 from the sensing cell FW2.

The prism 3 holds the cells FW1 and FW2 at positions such that when the objective 1 focuses sharply on the film, i.e., the desired focal plane, it also focuses sharply upon a first high definition plane HD1 passing through the plate 4 and located a distance S ahead of the photosensitive surface of the cell FW1 equal to half the thickness of the plate 4. At the same time the objective 1 focuses upon a high definition plane HD2 a distance equal to S behind the light sensitive surface of the photoresistor FW1.

The material PM in FIG. 1 is preferably in the form of a light-sensitive coat so that its thickness or depth is minimal.

Thus during sharp focusing, sharp images appear at a distance $S = \frac{1}{2}$ the thickness of the plate 4 ahead of the photosensitive coat of the cell FW1 and the same distance behind the corresponding coat of the photoresistor FW2.

As mentioned, the cells FW1 and FW2 are connected in the circuit CC as shown in FIG. 2. Here, the two photoconductive cells FW1 and FW2 form a voltage divider between the positive and negative terminals plus B and minus B of a voltage source.

The voltage divider point P1 between the cells controls the gate of a field effect transistor T1. The latter is connected as a source follower, i.e., a drain switch, with a resistor R1 and two diodes Di1 and Di2 so as to exhibit a high-ohmic input resistance and thereby avoid undesired loading of the high resistance photoconductive cells FW1 and FW2, whose resistances are of the order of a megohm each.

The divider circuit renders the divider point P1 virtually independent of over several decimal powers of illumination changes when the conductive cells are illuminated equally.

The source follower connected field effect transistor T1 operates a double push-pull driver composed of complementary transistors T2, T3, T4, and T5 as well as resistor R2 to R9.

Two pairs of series connected diodes, namely pair Di1 and Di2 and pair Di3 and Di4, generate the necessary base bias voltages between the bases of the driver transistors T2 and T3 on the one hand, and T4 and T5 on the other. The first pair of diodes Di1 and Di2 appear in the path of main current flow of the field effect transistor T1. The second pair of diodes Di3 and Di4 appear between the terminals +B and −B interposed between divider resistors R10, R11, and R12. The resistor R12 is variable and serves as a trimming resistor so that the circuit can be adjusted for symmetry. Resistors $R_2$ to $R_9$ bias the transistors.

The driver stage drives an output or power double push-pull circuit composed of complementary transistors T6, T7, and T8, T9 whose bases are coupled with the circuit points P2, P3, and P4, P5, of the driver stage. The power stage energizes a DC motor M connected across opposite point P7 and P8 of the bridge formed by the driver stage. The motor M drives the objective 1 as shown in FIG. 3. A variable feedback resistor R13 connects the switching point P7 to a switching point P6 between the diodes Di3 and Di4.

In operation, the field effect transistor P1 of FIG. 2 controls the bases of the double push-pull driver stage in such a way that only one pair of diagonally opposed complementary transistors is opened. These transistors in turn open the complementary transistors of the respective diagonals in the double pus-pull connection of the power transformers.

If the objective of FIG. 3 is directed onto an object, and a sharper image appears on the photoconductive cell FW2 than on the photoconductive cell FW1, the resistance of photoconductive cell FW2 will exceed that of cell FW1. This raises the potential of the voltage dividing point P1 and hence the gate potential of the field effect transistor T1. The source voltage which is dependent upon the gate voltage and which exceeds the gate voltage by the pinch-off voltage of about one volt, similarly increases and opens the transistor T2. The emitter line LE common to all four driver transistors T2 to T5 opens the PNP transistor T5. This action turns on the PNP power transistor T6 and the NPN power transistor T9 and connects the terminal K3 of the motor M to the positive pole and the terminal K4 to the negative pole of the voltage source B. The DC motor rotates in the direction determined by the polarity of the supply voltage. It drives the range finder of the objective through a reduction gear not shown until both photoconductive cells FW1 and FW2 exhibits the same resistance values.

As was previously stated the objective 1, when it produces a sharp image on the focal plane of the camera, produces sharp images in the planes HD1 and HD2. This produces an approximately equally blurred or sharp image on each of the cells FW1 and FW2. When the objective 1 is moved forward within the camera, thereby blurring the image in the focal plane, one focus control image departs from the plane HD1 and moves further from the sensing surface of the cell FW1, while the other image departs from the plane HD2 and moves closer to the sensing surface of the cell FW2. Under these circumstances the cell FW2 is subjected to a sharper image than the cell FW1 and thereby exhibits a higher resistance. If the objective 1 is moved closer to the focal plane than the ideal focusing position, the image projected upon the cell FW1 is sharper than the image projected upon the cell FW2. Thus the cell FW1 exhibits the higher resistance. Since the motor M moves the objective 1 toward the position of equality of the two resistances of the cells, the objective 1 ultimately reaches the position corresponding to the one in which it focuses precisely upon the camera's focal plane.

In the case described with respect to FIG. 2, a sharper image is produced on the coat of the photoconductive cell FW2 than on the coat of the photoconductive cell FW1. In this case the plane of optimum definition before adjustment is closer to the coat of photoconductive cell FW2 than to the coat of photoconductive cell FW1, that is, is has moved in the direction of the objective.

This means that the image distance is small and that the object is farther away from the objective of the camera than the momentary required distance for sharp focusing. Thus, the motor moves the objective in the direction of a greater distance until the images are again in the vicinity of the nominal planes HD1 and HD2 of the photoconductive cells FW1 and FW2, with the exception of a residual error. This produces sharp focusing.

Figure 4:
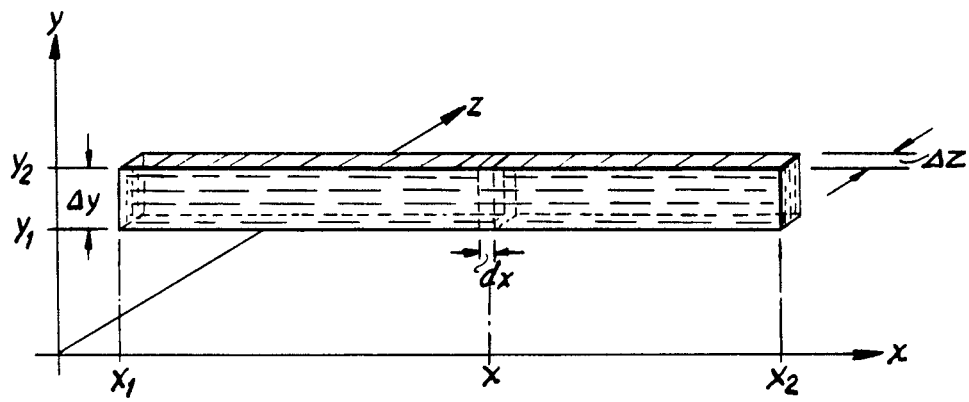
FIG. 4 is a perspective view of a row of photoconductive cells located in a coordinate system for the purpose of analyzing the operation according to the invention.

The principles upon which operation of the cells FW1 and FW2 in FIGS. 1 to 3 operate, as well as the dimensioning rules for making each photoconductive cell definition-sensitive according to the invention will be described with respect to FIGS. 4 to 10. For the purpose of this analysis, one horizontal strip of the photoconductive material PM in the cell FW1 is considered. It is assumed that a photographic objective produces a substantially sharp image of an original on the surface of the photoconductive cell, and that along the horizontal strip the image is composed of a periodic arrangement of vertical bands with an illumination distribution varying periodically along the horizontal. FIG. 4 shows such a strip having a rectangular cross-section within a coordinate system. The illumination distribution varies in the direction of the X axis.

The rectangle of FIG. 4 has the dimensions shown, namely

| | |
|---|---|
| Width: | $\Delta y = y_2 - y_1$ |
| Length: | $\Delta x = x_2 - x_1 = \int dx$ |
| Thickness: | $\Delta z = z_2 - z_1$ |

The number of light-dark periods per mm of the curtain pattern reproduced by the objective on this photoconductive cell layer, that is, the spatial frequency $n$, is selected so that at least one full period falls on the rectangular photoconductive cell layer. The electrical behavior of this arrangment may be considered by calculating the means resistance $\bar{R}_x$ per period by integrating over such a period.

At any instant, when an object is sharply focused upon the photoconductive material, the illumination distribution, i.e., the brightness, along the horizontal axis varies according to the following function $$B(x) = a + b \sin(2\pi n x) \quad \text{(lux)}$$

where
$a$ = the mean value of the illumination, and
$b$ = the amplitude of the illumination variations, assuming $$|b| < |a|$$

Maximum and minimum illumination values appear at the following points of the pattern. Particularly maximum illumination equal to $$B_{max} = a + b \quad \text{(lux)}$$

occurs at points $$2\pi n x = +\frac{\pi}{2}; +\frac{5\pi}{2}; -\frac{3\pi}{2} \ldots$$

Minimum illumination $$B_{min} = a - b \quad \text{(lux)}$$

occurs at points $$2\pi n x = -\frac{\pi}{2}; -\frac{3\pi}{2}; +\frac{9\pi}{2} \ldots$$

The fine contrast of this pattern is defined by the ratio of the maximum to the minimum illumination, namely, $$k = \frac{B_{max}}{B_{min}} = \frac{a+b}{a-b} = \frac{1+\frac{b}{a}}{1-\frac{b}{a}}$$

Thus, the fine contrast, and hence the definition, depend on the ratio of the amplitude variation $b$ to the mean value $a$ in such a way that both increase with increasing amplitude variation $b$.

Each optical system, hence the objective lens, acts like a low-pass filter having a maximum bandwidth at maximum definition.

Figure 5:
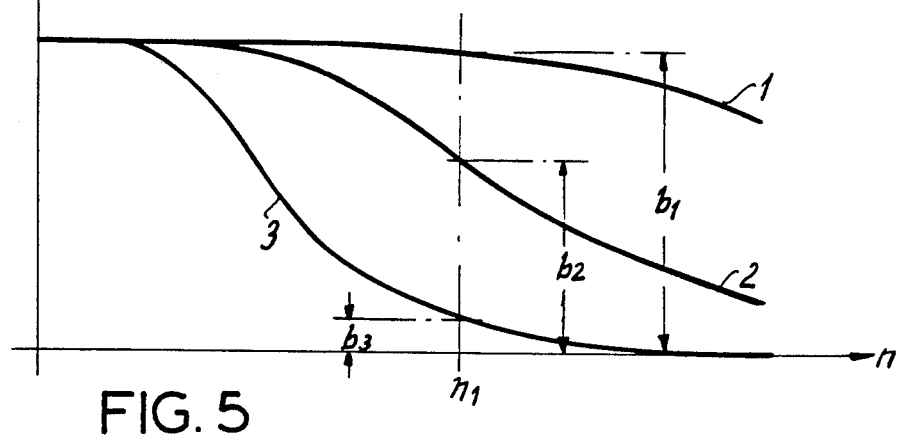
FIG. 5 is a graph illustrating the dependence of the variation of amplitude of the illumination on the spatial frequency for three difference image qualities.
Figure 6A:
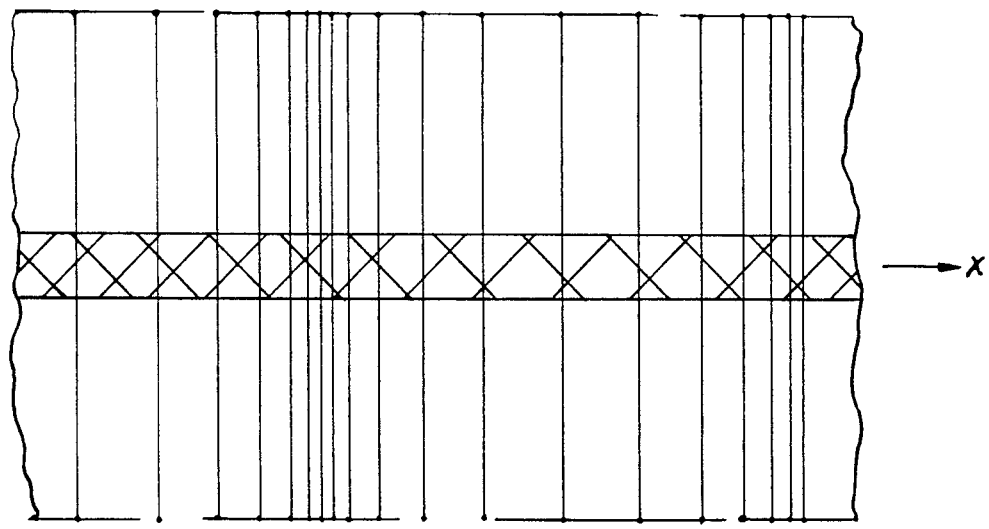
FIG. 6a is a schematic arrangement showing the top view of a row of photoconductive cells utilized according to the invention and shown for the purpose of analyzing the operation.
Figure 6B:
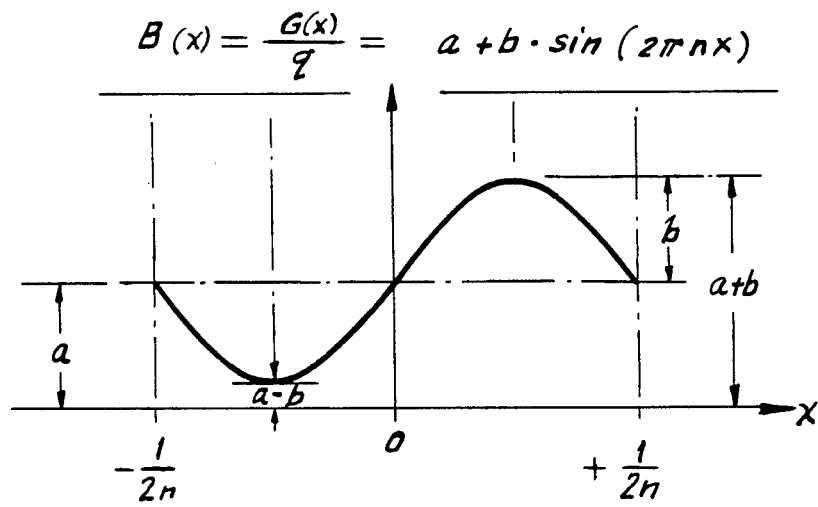
Figure 7:
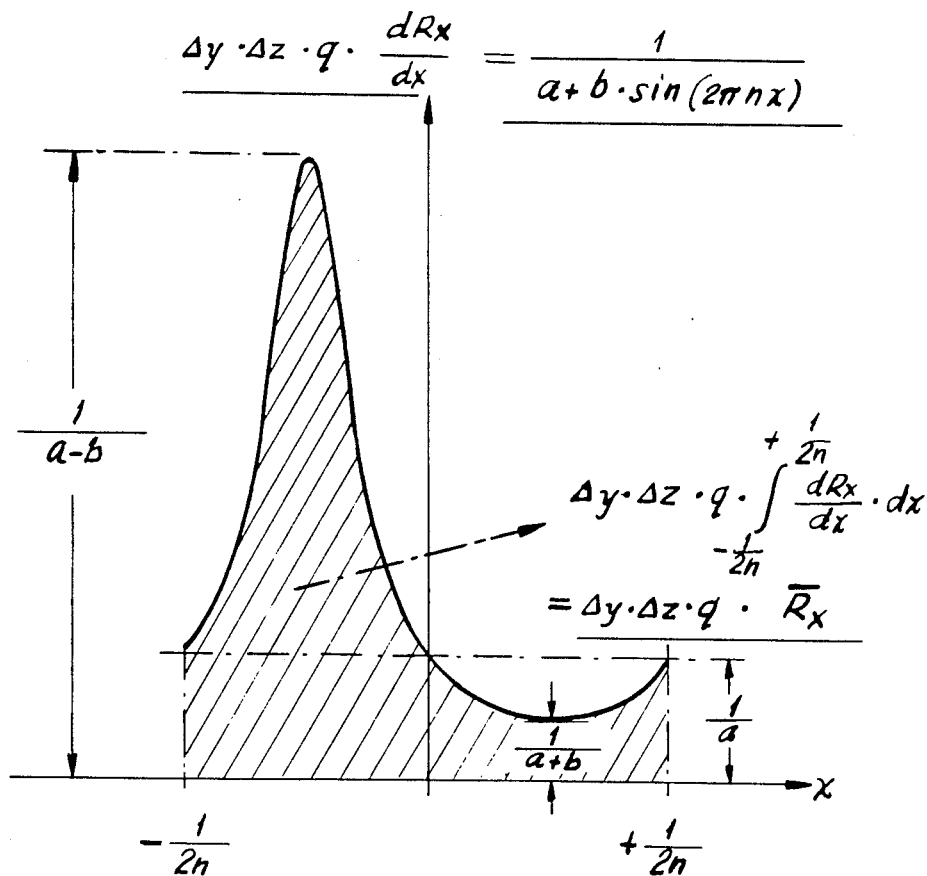
FIG. 7 is a graph illustrating the dependence of the electrical resistance of an elementary or incremental region in the X direction at the site X.
Figure 8:
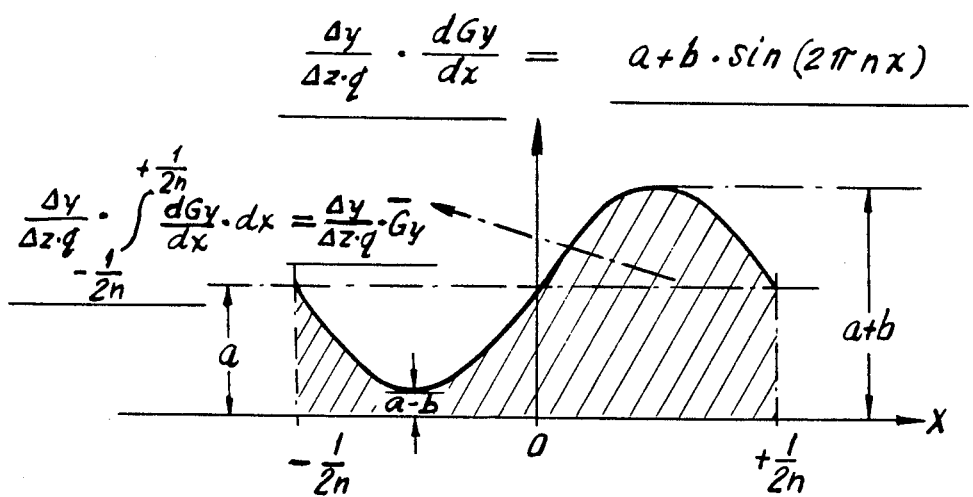
FIG. 8 is a graph illustrating the dependence of electrical conductance of the elementary or incremental regions in the Y direction on the site X.
Figure 9:
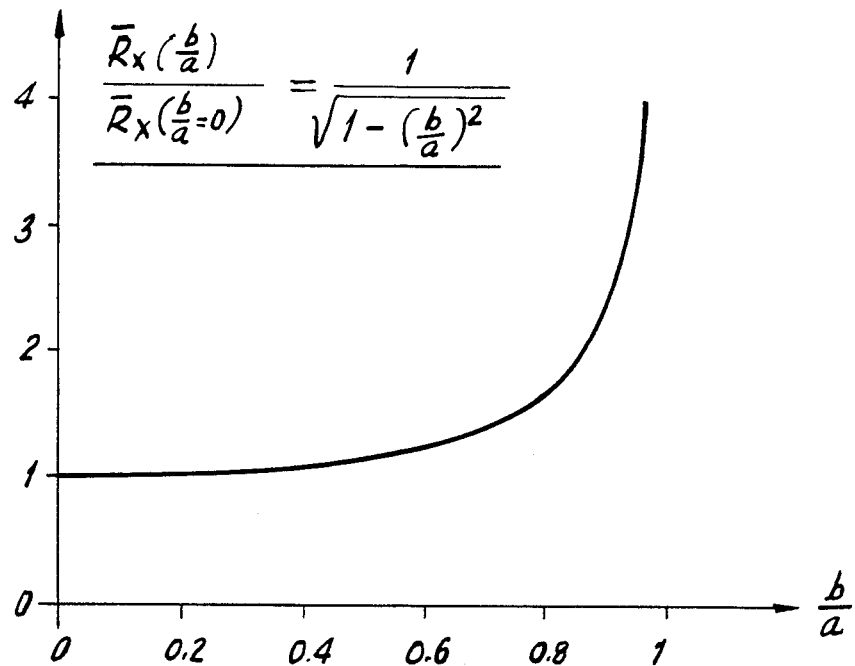
FIG. 9 is a graph illustrating the dependence of the mean resistance per period measured in the X direction on the ratio of the variation amplitude $b$ to the mean value $a$ of the illumination.
Figure 10:
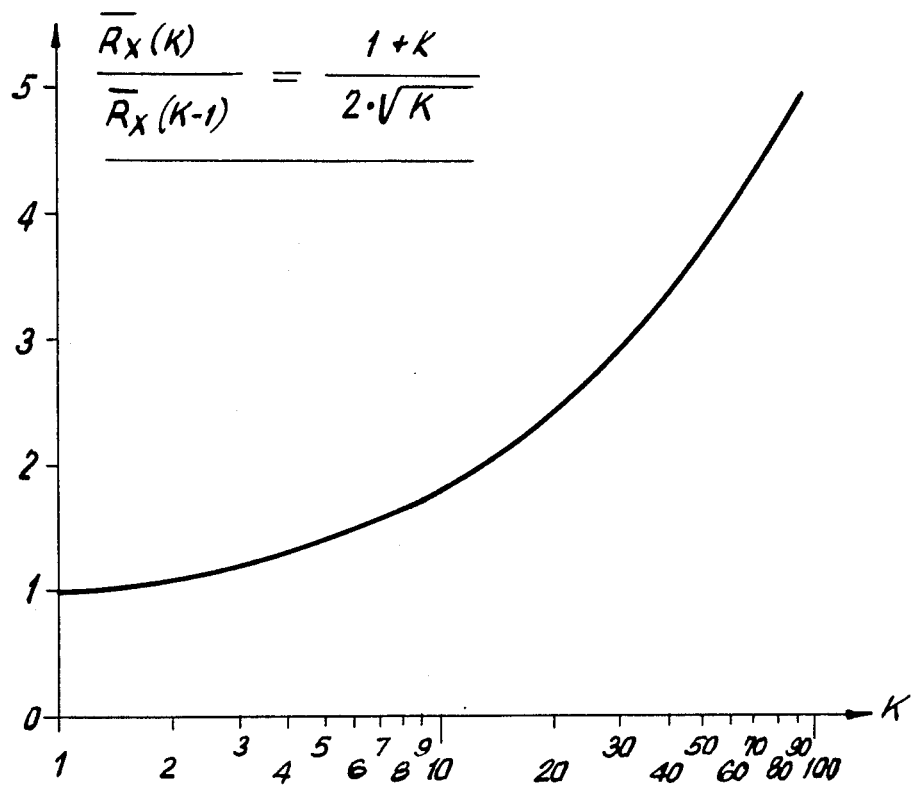
FIG. 10 is a graph illustrating the dependence of the relative mean resistance per period on the fine contrast.

FIG. 5 illustrates the influence of this low-pass filter characteristic on the amplitude of the variations (alternation amplitude) $b$ with the selected spatial frequency $n_1$ of the pattern for three different fine contrast values 1, 2, and 3. This calculation is also started with an elongated rectangular photoconductive cell, or portion of a cell, or a so-called photoconductive cell row, as shown in FIG. 4. Here the elementary or differential region has the following volume at the point $x$.

$$dv = \Delta y \cdot \Delta z \cdot dx \quad \text{(in mm}^3\text{)}$$

where the layer width is $$\Delta y = y_2 - y_1 \quad \text{(in mm)}$$

The layer thickness is $$\Delta z = z_2 - z_1 \quad \text{(in mm)}$$

For this calculation it is assumed that the light is directed perpendicularly onto the photoconductive cell in the direction of the $z$ axis.

Each elementary or differential region has a specific local conductance $\sigma(x)$. This specific conductance is, as a first approximation, directly proportional to the illumination $B(x)$ at that location. With the previously mentioned indicated changes in illumination on the surface of the photoconductive cell, this specific conductance, $$\sigma(x) = q^{B(x)} \quad \text{(in Ohm}^{-1}\text{mm}^{-1}\text{)}$$

where $q$ denotes the sensitivity of the photoconductive coat in.

Ohm$^{-1}$ mm$^{-1}$ lux$^{-1}$ or Mho/(mm.lux)

From the above, the distribution of the illumination B(x) is $$\nu(x) = qa + qb \sin(2\pi n x) \quad \text{(in mho/mm)}$$

In the above equation, $qa$ is the mean specific conductance while $qb$ is the amplitude of the sinusoidal variation of the specific conductance, and $n$ is the spatial frequency in periods per mm.

The resistance $dr_x$ of one of the series connected differential or elementary regions measured in the $x$ direction as shown in FIG. 3 is $$dR_x = \frac{dx}{\Delta y \cdot \Delta z \cdot \sigma(x)} = \frac{dx}{\Delta y \cdot \Delta z \cdot q \cdot (a + b \sin(2\pi n x))}$$

The conductance of one of the differential region, as illustrated in FIG. 5, is $$dG_y = \frac{\Delta z \cdot o(x) \cdot dx}{\Delta y} = \frac{\Delta z \cdot q}{\Delta y} \cdot (a + b \cdot \sin(2\pi nx)) \; [\text{Ohm}^{-1}]$$

This conductance is, of course, connected in parallel to the conductances of the adjacent differential volumes.

In the direction of the X axis, the partial or differential resistances $dr_x$ of the differential regions add up, between the points $x_1$ and $x_2$, to a total resistance $$R x_{ges} = \int_{x1}^{x2} dR_x = \frac{1}{\Delta y \cdot \Delta z \cdot q} \cdot \int_{x1}^{x2} \frac{dx}{(a + b \cdot \sin(2\pi nx))} \; [\text{Ohm}]$$

Of particular interest in this periodic distribution of illumination $B(x)$ is the mean resistance $R_x$ per period with $\alpha = 2\pi nx$, and the period of this argument $-\pi \leq \alpha \leq \pi$ we obtained $$\bar{R}_x = \frac{1}{\Delta y \cdot \Delta z \cdot q} \cdot \frac{dx = \frac{d\alpha}{2\pi n}}{-\frac{1}{2n}} \int_{-\frac{1}{2n}}^{\frac{1}{2n}} \frac{dx}{(a + b \cdot \sin(2\pi nx))} \; [\text{Ohm}]$$

The transformation $$x \longrightarrow \alpha$$

$$\bar{R}_x = \frac{1}{2\pi n \cdot \Delta y \cdot \Delta z \cdot q} \int_{-\pi}^{+\pi} \frac{d\alpha}{(a + b \cdot \sin \alpha)} \; [\text{Ohm}]$$

The above integral is solved as follows $$\int_{-\bar{\mu}}^{+\bar{\mu}} \frac{d\alpha}{(a + b \cdot \sin \alpha)} = \frac{2}{\sqrt{a^2 + b^2}} \arctan\left(\frac{a \cdot \tan\frac{\alpha}{(2)} + b}{\sqrt{a^2 - b^2}}\right)$$

Because of the singularity of $\tan(\alpha/2)$ when $\alpha_1 = -\pi$, and $\alpha_2 = +\pi$, the integral is first solved for $\alpha_1 > -\pi$; $\alpha_2 < +\pi$ and then the passage to the limit $\alpha_2 \to -\pi$; $\alpha_2 \to \pi$ is effected. Thus $$\int_{-\pi}^{+\pi} \frac{d\alpha}{(a + b \sin \alpha)} = \lim_{\substack{\alpha_1 \to -\pi \\ \alpha_2 \to +\pi}} \int_{\alpha_1}^{\alpha_2} \frac{d\alpha}{(a + b \sin \alpha)}$$

$$= \lim_{\substack{\alpha_1 \to -\pi \\ \alpha_2 \to +\pi}} \frac{2}{\sqrt{a^2 - b^2}} \left\{ \arctan\left(\frac{a \cdot \tan\frac{\alpha_2}{(2)} + b}{\sqrt{a^2 - b^2}}\right) - \arctan\left(\frac{a \cdot \tan\frac{\alpha_1}{(2)} + b}{\sqrt{a^2 - b^2}}\right) \right\}$$

$$= \lim_{\substack{\alpha_1 \to -\pi \\ \alpha_2 \to +\pi}} \frac{2}{\sqrt{a^2 - b^2}} \left\{ \arctan\left(\frac{a \tan\frac{\alpha_2}{(2)} + b}{\sqrt{a^2 - b^2}}\right) + \arctan\left(\frac{a \tan\frac{|\alpha_1|}{(2)} - b}{\sqrt{a^2 - b^2}}\right) \right\}$$

In the passage of the limits $\alpha_1 \to -\pi$; $\alpha_2 \to \pi$, the integration limits $(\alpha_1, \alpha_2)$ causes the values $\tan(|\alpha_1|/2)$ and $\tan(\alpha_2/2)$ to increase drastically, so that the summand $b$ can be neglected and both arctan functions tend toward the same limit value $\pi/2$.

Thus:

$$\lim_{\alpha_2 \to +\pi} \arctan\left(\frac{a \tan\left(\frac{\alpha_2}{\alpha}\right) + b}{\sqrt{a^2 - b^2}}\right) = \frac{\pi}{2}$$

$$\lim_{\alpha_1 \to -\pi} \arctan\left(\frac{a \cdot \tan\frac{|\alpha_1|}{\alpha} - b}{\sqrt{a^2 - b^2}}\right) = \frac{\pi}{2}$$

The solution of the integral then reads $$\int_{-\pi}^{+\pi} \frac{d\alpha}{(a + b \cdot \sin \alpha)} = \frac{2\pi}{\sqrt{a^2 - b^2}}$$

Hence, the mean resistance $\bar{R}_x$ per period is $$\bar{R}_x = \frac{1}{n \cdot \Delta y \cdot \Delta z \cdot g \cdot \sqrt{a^2 - b^2}} =$$

$$\frac{1}{n \cdot \Delta y \cdot \Delta z \cdot g \cdot \sqrt{1 - \left(\frac{b}{a}\right)^2}} \; [\text{Ohm}]$$

The mean resistance $\bar{R}_x$ depends upon the ratio of the amplitude $b$ of the variation to the mean value $a$ of the illumination $B(x)$ according to the following equation:

$$\bar{R}_x = \frac{K}{\sqrt{1 - \left(\frac{b}{a}\right)^2 2}} \; [\text{Ohm}]; \; K = \frac{1}{n \cdot s \cdot \Delta y \cdot \Delta z \cdot g}$$

According to other embodiments of the invention, the cells FW1 and FW2 of FIGS. 1 and 2 are formed of a plurality of photo diodes arranged as a mosaic in the image plane along the bifilar paths and connected to each other so as to form an OR gate or an AND gate which generates a control signal on a common load resistance in dependence on the image detail brightness.

Examples of such embodiments are shown in FIGS. 11 to 14.

In FIG. 11 an OR gate is composed of $n$ voltage dividers. The first voltage divider is composed of a series connected photo diode $FD_1$, potential equalizing diodes $PD_1$ and operating resistance $r_1$ all arranged between the terminals $+B$ and $-B$ of a voltage source. The remaining voltage dividers include photo diodes $FD_2 \ldots FD_n$, equalizing diodes $PD_2 \ldots PD_n$ and working resistances $r_2 \ldots r_n$. The forward direction of the photo diode is opposite to the forward direction of the potential equalizing diodes. Respective gate diodes GD$_1$, GD$_2$ . . . GD$_n$ connect divider points P$_1$, P$_2$ . . . P$_n$ to the load resistance R which is common to all the gate diodes. The load resistance is connected between the gate diodes and the negative terminal −B of the source.

For simplicity the photo diodes will be referred to as FD, the potential equalizing diodes PD, the gate diodes GD, the operating resistance r, and the points P without their subscripts.

In this OR circuit the photo diode FD whose light sensitive coat receives the greatest illumination exhibits the lowest resistance. The potential of the corresponding divider point P is then highest, that is, most positive. This potential then determines the output potential of the OR circuit which therefore assumes its maximum value at optimum definition, due to the fact that it is then that the image detail brightness is greatest.

In contrast to this circuit, the circuit of FIG. 12 operates as an AND gate where the maximum image detail brightness produces the lowest voltage drop on the resistance R. Here, like reference characters designate like parts. Within each voltage divider current passes from the positive terminal +B of the source through the operating resistor r, the potential equalizing diode PD, and the photo diode FD. A gate diode GD connects the divider point P to the load resistor R whose other side is connected to the positive terminal +B of the source.

Again in this circuit, the photo diode with the greatest illumination determines the output potential but the potential of this voltage divider is lowest, that is, most negative so that the output potential assumes a minimum value at optimal definition. This is so because the image detail brightness is then greatest.

FIG. 13 illustrates another version of an OR gate which supplies the maximum output potential with minimum image detail brightness. The voltage dividers forming the elements of the OR gate are composed of the following order of elements, namely operating resistance r, potential equalizing diode PD, and photo diode FD. A gate diode GD again connects the divider point to the resistor R.

In this circuit, the potential is highest at the point P whose corresponding photo diode is subject to least illumination. That is, this point is most positive and determines the output potential of the load resistance R which therefore assumes a maximum value at optimum definition. This is due to the fact that the image detail brightness is then lowest.

FIG. 14 illustrates another embodiment of an AND gate. Here the output potential assumes a minimum value on the common load resistance R with minimum image detail brightness. The order of the structural elements in the voltage divider has been changed relative to that of FIG. 13. Current flows from the positive terminal +B of the source S through the photo diode FD, the potential equalizing diode PD, the divider point P, and the operating resistor r. Gate diodes GD connect the respective points P to the load resistance R. The potential on the divider point P of the voltage divider whose photo diode is subject to the least illumination is lowest, that is, most negative. This determines the output potential of the AND circuit which therefore assumes a minimum value at optimal definition. This is due to the fact that it is then that the image detail brightness is lowest.

It should be noted that the term "photoconductive cell" is used interchangeably with the term "photoresistor" in the context of this application.

While embodiments of the invention have been described in detail, it will be obvious to those skilled in the art that the invention may be embodied otherwise without departing from its spirit and scope.

What is claimed is:

1. A detecting circuit for detecting the sharpness of an image formed by an image forming optical system, comprising:
   A. a plurality of photosensitive members having semiconductor junctions of opposite conductivity, said members being disposed in a coplanar mosaic arrangement, said photosensitive members emitting respective electrical outputs in response to the intensity of illumination of the members by respective portions of the image formed by the image forming optical system;
   B. a plurality of resistors having respective constant resistance values, a plurality of coupling means each individually connecting one of said resistances in series with a respective one of said members to form respective series circuits exhibiting signal values at the coupling means, the signal values varying between a minimum extreme signal value and a maximum extreme signal value,
      i. each of said circuits being connected in parallel with one another;
   C. comparing means electrically coupled to said coupling means for producing an output in response only to the one of the extremes of the signal values, whereby the sharpness of the object image formed by means of the image forming optical system may be detected on the basis of the output from said comparing means.

2. A circuit according to claim 1, in which said comparing means includes a plurality of gate diodes each individually coupled to one of said coupling means.

3. A detecting circuit according to claim 2, in which said series circuit each includes a potential equalizing diode interposed and connected between the member and the resistor of the series circut.

4. A detecting circuit according to claim 3, further comprising a direct-current source connected across each series circuit.

5. A detecting circuit according to claim 1, in which said photosensitive members are disposed in a coplanar arrangement forming a matrix shape.

6. A detecting circuit according to claim 1, in which said members are formed of silicon photosensitive material.

7. A detecting circuit according to claim 6, in which said photosensitive members, said resistors and said comparing means are formed as part of an integrated circuit.

8. A circuit as in claim 1, wherein said comparing means produces an output in response only to the maximum one of the signal values.

9. An apparatus as in claim 8, wherein said comparing means includes a plurality of gas diodes each individually coupled to one of said coupling means.

10. An apparatus as in claim 8, wherein said series circuit each includes a potential equalizing diode interposed and connected between the member and the resistor at the series circuit.

11. An apparatus as in claim 8, wherein a direct-current source is connected across each series circuit.

12. An apparatus as in claim 8, in which said photosensitive members are disposed in a coplanar arrangement forming a matrix shape.

13. An apparatus as in claim 8, in which said members are formed of silicon photosensitive material.

14. An apparatus as in claim 8, in which said photosensitive members, said resistors and said comparing means are formed as part of an integrated circuit.

15. An apparatus as in claim 1, wherein said comparing means produces an output in response only to the minimum one of the signal values.

16. An apparatus as in claim 15, in which said comparing means includes a plurality of gate diodes each individually coupled to one of said coupling means.

17. An apparatus as in claim 15, in which said series circuit each inludes a potential equalizing diode interposed and connected between the member and the resistor of the series circuit.

18. An apparatus as in claim 15, further comprising a direct-current source connected across each series circuit.

19. An apparatus as in claim 15, in which said photosensitive members are disposed in a coplanar arrangement forming a matrix shape.

20. An apparatus as in claim 15, in which said members are formed of silicon photosensitive material.

21. An apparatus as in claim 15, in which said photosensitive members, said resistors and said comparing means are formed as part of an integrated circuit.

22. An apparatus as in claim 1, wherein said photosensitive members are micro-photo-diodes.

23. An apparatus as in claim 22, in which said comparing means includes a plurality of gate diodes each individually coupled to one of said coupling means.

24. An apparatus as in claim 23, wherein said series circuit each includes a potential equalizing diode interposed and connected between the member and the resistor of the series circuit.

25. An apparatus as in claim 22, further comprising a direct-current source connected across each series circuit.

26. An apparatus as in claim 22, in which said photosensitive members are disposed in a coplanar arrangement forming a matrix shape.

27. An apparatus as in claim 22, wherein said members are formed of silicon photosensitive material.

28. An apparatus as in claim 22, in which said photosensitive members, said resistors and said comparing means are formed as part of an integrated circuit.

29. An apparatus as in claim 1, wherein said photosensitive members are micro-photo-transistors.

30. An apparatus as in claim 29, wherein said comparing means includes a plurality of gate diodes each individually coupled to one of said coupling means.

31. An apparatus as in claim 29, wherein said series circuit each includes a potential equalizing diode interposed and connected between the member and the resistor of the series circuit.

32. An apparatus as in claim 29, further comprising a direct-current connected across each series circuit.

33. An apparatus as in claim 29, in which said photosensitive members are disposed in a coplanar arrangement forming a matrix shape.

34. An apparatus as in claim 29, wherein said members are formed of silicon photosensitive material.

35. An apparatus as in claim 29, wherein said photosensitive members, said resistors and said comparing means are formed as part of an integrated circuit.

36. A circuit as in claim 35, wherein said member responds only to the maximum signal value.

37. An apparatus as in claim 36, wherein said comparing means includes a plurality of gate diodes each individually coupled to one of said coupling means.

38. An apparatus as in claim 36, wherein said series circuit each includes a potential equalizing diode interposed and connected between the member and the resistor of the series circuit.

39. An apparatus as in claim 36, further comprising a direct-current source connected across each series circuit.

40. An apparatus as in claim 36, in which said photosensitive members are disposed in a coplanar arrangement forming a matrix shape.

41. An apparatus as in claim 36, wherein said members are formed of silicon photosensitive material.

42. An apparatus as in claim 36, wherein said photosensitive members, said resistors and said comparing means are formed as part of an integrated circuit.

43. A detecting circuit for detecting the sharpness of an image formed by an image forming optical system, comprising:
   A. a plurality of micro-photo-conductive elements disposed in a coplanar arrangement forming in a mosaic pattern, said photo-conductive elements respectively emitting an electrical output in response to the intensity of illumination thereof;
   B. a plurality of resistors each having a constant resistance value and individually connected in series with one of said photoconductive elements;
      i. each photo-conductive element and each resistor connected thereto forming a series circuit, said series circuits being connected in parallel with each other;
   C. comparing means for comparing the output of each of said photo-conductive elements, said comparing means being electrically coupled with each juncture between said photo-conductive element and said resistor for comparing the output value of each of said photo-conductive elements so as to give out only the maximum valued output of the photo-conductive element, whereby the sharpness of the object image formed by means of the image forming optical system is detected by virtue of the output emitted from said comparing means.

44. A detecting circuit for detecting the sharpness of an object image formed by an image forming optical system, comprising:
   A. a plurality of micro photo-conductive elements disposed in a coplanar arrangement forming a mosaic pattern, said photoconductive elements respectively emitting electrical output in response to the intensity of illumination thereof;
   B. a plurality of resistors each having a constant resistance value and individually connected in series with one of said photo-conductive elements;
      i. each photo-conductive element and each resistor connected thereto forming a series circuit, said series circuits being respectively connected in parallel with each other;
   C. comparing means for comparing the output of each of said photo-conductive elements; said comparing means being electrically coupled with each juncture between said photo-conductive element and said resistor for comparing the output value of each of said photo-conductive elements so as to give out only the minimum valued output of the photo-conductive element; whereby the sharpness of the object image formed by means of the image forming optical system is detected by virtue of the output issued from said comparing means.

45. A circuit for detecting the sharpness of an object image forming optical system, comprising:

A. a plurality of micro-sensitive elements having photo-conductive property disposed in a coplanar arrangement forming a mosaic pattern, each of said photosensitive elements being respectively adapted to change an electrically conducting state thereof in response to variations in the intensity of illumination thereof;

B. means for supplying an electric potential to said photo-sensitive elements, said means being electrically coupled with each of said photo-sensitive elements respectively, C. OR-gate means having a plurality of input terminal and at least one input terminal, each of said input terminals being individually coupled with each of said photo-sensitive elements;

D. output means electrically coupled with the output terminal of said gate means for generating an electrical output corresponding to the image sharpness on the basis of the output from said gate means.

46. A circuit for detecting the sharpness of an object image formed by an image forming optical system, comprising:

A. a plurality of micro photo-sensitive elements having photo-conductive property disposed in a coplanar arrangement forming a mosaic pattern, each of said photosensitive elements being respectively adapted to change an electrically conducting state thereof in response to variation in the intensity of illumination thereof;

B. means for supplying an electric potential to said photo-sensitive elements; said means being electrically coupled with each of said photo-sensitive elements respectively;

C. AND gate means having a plurality of input terminals and at least one output terminals, said input terminals being coupled individually with each of said photo-sensitive elements;

D. output means electrically coupled with said gate means at the output terminal, said output means being adapted to generate an electrical output corresponding to the image sharpness on the basis of the output from said gate means.

* * * * *